(12) United States Patent
Mori et al.

(10) Patent No.: US 12,087,588 B2
(45) Date of Patent: Sep. 10, 2024

(54) SUBSTRATE PROCESSING APPARATUS AND SUBSTRATE PROCESSING METHOD

(71) Applicant: Tokyo Electron Limited, Tokyo (JP)

(72) Inventors: Hirotoshi Mori, Koshi (JP); Yoshihiro Kawaguchi, Koshi (JP); Kazuya Hisano, Koshi (JP); Hayato Tanoue, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 651 days.

(21) Appl. No.: 17/287,558

(22) PCT Filed: Sep. 3, 2019

(86) PCT No.: PCT/JP2019/034566
§ 371 (c)(1),
(2) Date: Apr. 22, 2021

(87) PCT Pub. No.: WO2020/084909
PCT Pub. Date: Apr. 30, 2020

(65) Prior Publication Data
US 2022/0359212 A1   Nov. 10, 2022

(30) Foreign Application Priority Data
Oct. 23, 2018  (JP) .................................. 2018-199406

(51) Int. Cl.
*H01L 21/304* (2006.01)
*B23K 26/53* (2014.01)
(Continued)

(52) U.S. Cl.
CPC ............ *H01L 21/304* (2013.01); *B23K 26/53* (2015.10); *H01L 21/30604* (2013.01);
(Continued)

(58) Field of Classification Search
CPC ............ H01L 21/304; H01L 21/30604; H01L 21/67092; H01L 21/67259; H01L 21/681;
(Continued)

(56) References Cited

U.S. PATENT DOCUMENTS

| 2006/0079155 A1* | 4/2006 | Nakamura ............ H01L 21/302 451/41 |
| 2018/0076043 A1* | 3/2018 | Ito ...................... B23K 26/0823 |

FOREIGN PATENT DOCUMENTS

| CN | 101131921 A | 2/2008 |
| JP | H9-216152 A | 8/1997 |

(Continued)

OTHER PUBLICATIONS

International Search Report of PCT/JP2019/034566 dated Nov. 12, 2019.

*Primary Examiner* — Christopher W Raimund
(74) *Attorney, Agent, or Firm* — Shih IP Law Group, PLLC.

(57) ABSTRACT

A substrate processing apparatus includes a holder configured to hold a combined substrate in which a first substrate and a second substrate are bonded to each other; a first detector configured to detect an outer end portion of the first substrate; a second detector configured to detect a boundary between a bonding region where the first substrate and the second substrate are bonded and a non-bonding region located at an outside of the bonding region; a periphery removing device configured to remove a peripheral portion of the first substrate as a removing target from the combined substrate held by the holder.

21 Claims, 13 Drawing Sheets

(51) Int. Cl.
    *H01L 21/306* (2006.01)
    *H01L 21/67* (2006.01)
    *H01L 21/68* (2006.01)
    *H01L 21/687* (2006.01)

(52) U.S. Cl.
    CPC .. *H01L 21/67092* (2013.01); *H01L 21/67259* (2013.01); *H01L 21/681* (2013.01); *H01L 21/68764* (2013.01)

(58) Field of Classification Search
    CPC ............... H01L 21/68764; H01L 22/12; H01L 21/3043; B23K 26/53; G01B 11/24
    See application file for complete search history.

(56) References Cited

FOREIGN PATENT DOCUMENTS

| | | | | |
|---|---|---|---|---|
| JP | H9216152 | * | 8/1997 | |
| JP | 2015-102389 A | | 6/2015 | |
| JP | 2016096295 A | * | 5/2016 | ....... H01L 21/02016 |

\* cited by examiner

FIG. 19
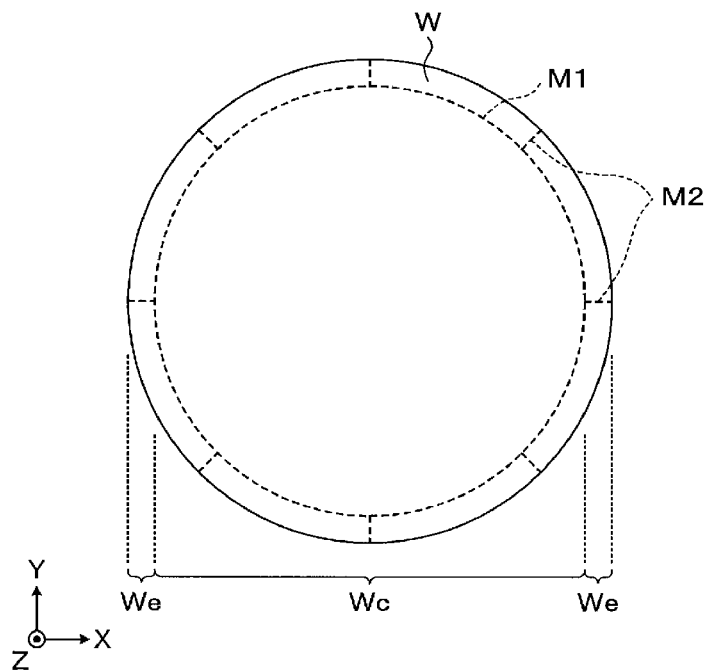
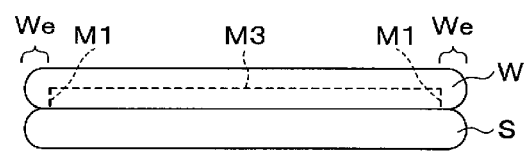
FIG. 20A
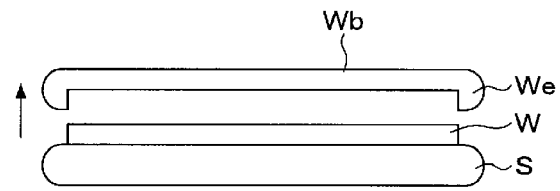
FIG. 20B

SUBSTRATE PROCESSING APPARATUS AND SUBSTRATE PROCESSING METHOD

CROSS-REFERENCE TO RELATED APPLICATIONS

This Application is a U.S. national phase application under 35 U.S.C. § 371 of PCT Application No. PCT/JP2019/034566 filed on Sep. 3, 2019, which claims the benefit of Japanese Patent Application No. 2018-199406 filed on Oct. 23, 2018, the entire disclosures of which are incorporated herein by reference.

TECHNICAL FIELD

The various aspects and embodiments described herein pertain generally to a substrate processing apparatus and a substrate processing method.

BACKGROUND

It is described in Patent Document 1 that a disk-shaped grinding tool having abrasive grains on an outer peripheral portion thereof is rotated and at least an outer circumferential surface of the grinding tool is brought into linear contact with a semiconductor wafer to grind a circumferential end of the semiconductor wafer into a substantially L-shape. The semiconductor wafer is manufactured by bonding two sheets of silicon wafers.

PRIOR ART DOCUMENT

Patent Document 1: Japanese Patent Laid-open Publication No. H09-216152

DISCLOSURE OF THE INVENTION

Means for Solving the Problems

In an exemplary embodiment, a substrate processing apparatus configured to process a substrate includes: a holder configured to hold a combined substrate in which a first substrate and a second substrate are bonded to each other; a first detector configured to detect an outer end portion of the first substrate; a second detector configured to detect a boundary between a bonding region where the first substrate and the second substrate are bonded and a non-bonding region located at an outside of the bonding region; a periphery removing device configured to remove, from the combined substrate held by the holder, a peripheral portion of the first substrate as a removing target; a holder moving mechanism configured to move the holder in a horizontal direction; and a controller configured to control the holder, the first detector, the second detector, the periphery removing device and the holder moving mechanism. The controller performs: controlling the first detector to detect the outer end portion of the first substrate; calculating a first eccentric amount between a center of the holder and a center of the first substrate from a detection result obtained by the first detector; controlling the second detector to detect a boundary between the bonding region and the non-bonding region; calculating a second eccentric amount between the center of the holder and a center of the bonding region from a detection result obtained by the second detector; and determining a position of the holder with respect to the periphery removing device based on the second eccentric amount such that the center of the bonding region and a center of the peripheral portion are coincident.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 19 is a plan view illustrating the state in which the peripheral modification layer and the split modification layers are formed in the processing target wafer.

FIG. 20A and FIG. 20B are explanatory diagrams illustrating main processes of a wafer processing according to another exemplary embodiment.

DETAILED DESCRIPTION

Figure 1:
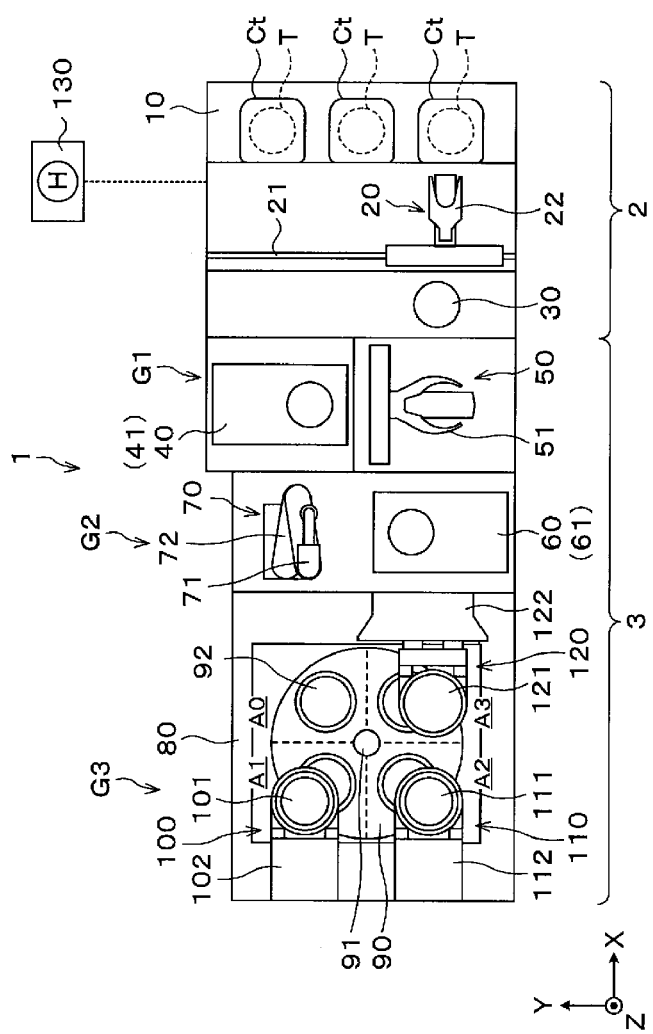
FIG. 1 is a plan view schematically illustrating a configuration of a wafer processing system according to an exemplary embodiment.

Here, in a manufacturing process for a semiconductor device, a semiconductor wafer having, for example, a plurality of electronic circuits on a front surface thereof is thinned by grinding a rear surface of the wafer. Then, if the thinned wafer is transferred or subjected to a subsequent processing as it is, bending or crack may occur in the wafer. Therefore, in order to reinforce the wafer, for example, bonding of the wafer to a support substrate is performed.

A peripheral portion of a wafer is typically chamfered, and if the wafer is ground as described above, the peripheral portion of the wafer has a sharply pointed shape (so-called "knife edge shape"). In this case, the peripheral portion of the wafer may be chipped and the wafer can be damaged. Therefore, before the grinding processing, trimming of the peripheral portion of the wafer (so-called "edge trimming") is performed.

The above-described end surface grinding apparatus disclosed in Patent Document 1 is configured to perform the edge trimming. The end surface grinding apparatus includes a chuck table, a spindle and a diamond wheel. The chuck table is configured to place a wafer thereon and is rotated around a Z-axis direction (vertical direction) as a rotation axis. The spindle is equipped with the diamond wheel at a tip end thereof and is rotated around a Y-axis direction (horizontal direction). Further, the spindle moves in the Y-axis direction and in the Z-axis direction. The diamond wheel is a disk-shaped grinding tool having diamond abrasive grains on an outer peripheral portion thereof. When an end surface of a peripheral portion of a wafer is ground by using this end surface grinding apparatus, the diamond wheel is brought into contact with the wafer by moving the spindle in the Y-axis direction and in the Z-axis direction while rotating the chuck table. As a result, the peripheral portion of the wafer is ground into a substantially L-shape.

Here, the peripheral portion of the wafer needs to be removed at a required position. In this end surface grinding apparatus, however, the wafer may be held while being deviated from the chuck table. If so, a center of the chuck table and a center of the wafer are deviated. Further, in the bonded wafer, a center of the wafer and a center of a bonding surface may be deviated. If the center of the chuck table, the center of the wafer and the center of the bonding surface are deviated from each other, the peripheral portion removed in the end surface grinding apparatus may be deviated from the required position. For the reason, the peripheral portion of the wafer needs to be aligned to the bonding surface of the wafer. In the end surface grinding apparatus described in Patent Document 1, however, this alignment is not considered. In this regard, there is still a room for improvement in the prior art edge trimming.

The present disclosure provides a technique capable of appropriately carrying out the edge trimming. Hereinafter, a wafer processing system equipped with a modifying apparatus as a substrate processing apparatus configured to perform the edge trimming appropriately and a wafer processing method as a substrate processing method according to exemplary embodiments will be described with reference to the accompanying drawings. In the present specification and the various drawings, parts having substantially same functions and configurations will be assigned same reference numerals, and redundant description will be omitted.

First, a configuration of a wafer processing system 1 according to an exemplary embodiment will be described. FIG. 1 is a plan view illustrating a schematic configuration of the wafer processing system 1.

Figure 2:
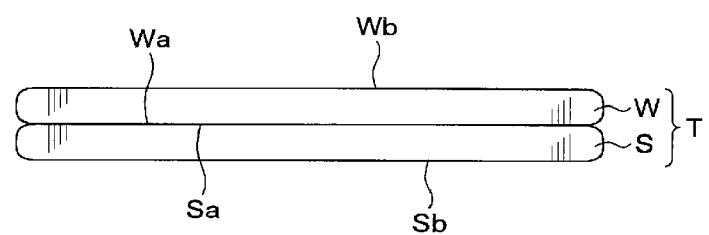
FIG. 2 is a side view illustrating a schematic structure of a combined wafer.
Figure 3:
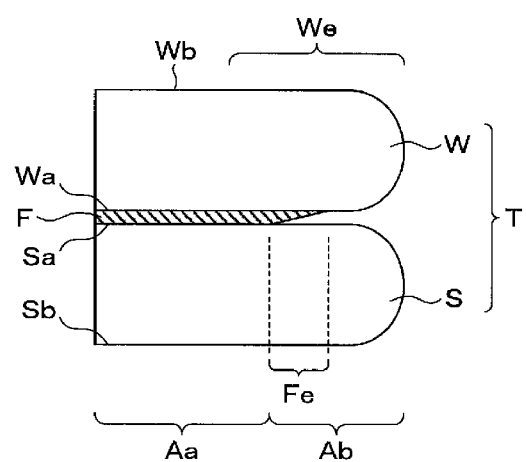
FIG. 3 is a side view illustrating a schematic structure of a part of the combined wafer.

The wafer processing system 1 performs a required processing on a combined wafer T as a combined substrate in which a processing target wafer W as a first substrate and a support wafer S as a second substrate are bonded to each other, as illustrated in FIG. 2 and FIG. 3. In the wafer processing system 1, a peripheral portion We of the processing target wafer W is removed, and the processing target wafer W is thinned. Hereinafter, in the processing target wafer W, a surface bonded to the support wafer S will be referred to as "front surface Wa," and a surface opposite to the front surface Wa will be referred to as "rear surface Wb." Likewise, in the support wafer S, a surface bonded to the processing target wafer W will be referred to as "front surface Sa," and a surface opposite to the front surface Sa will be referred to as "rear surface Sb."

The processing target wafer W is a semiconductor wafer such as, but not limited to, a silicon wafer, and is provided with a device layer (not shown) including a plurality of devices formed on the front surface Wa thereof. Further, an oxide film F, for example, a $SiO_2$ film (TEOS film) is further formed on the device layer. The peripheral portion We of the processing target wafer W is chamfered, and a thickness of the cross section of the peripheral portion We decreases toward a leading end thereof.

In FIG. 2, for the sake of simplicity of illustration, illustration of the oxide film F is omitted. In the other drawings recited in the following description, illustration of the oxide film F may sometimes be omitted as well.

The support wafer S is a wafer configured to support the processing target wafer W, and is, for example, a silicon wafer. An oxide film (not shown) is formed on the surface Sa of the support wafer S. Further, the support wafer S serves as a protection member which protects the devices on the front surface Wa of the processing target wafer W. Further, if the support wafer S has a plurality of devices formed on the front surface Sa thereof, a device layer (not shown) is formed on the front surface Sa, the same as in the processing target wafer W.

Here, if the processing target wafer W and the support wafer S are bonded at the peripheral portion We of the processing target wafer W, the peripheral portion We may not be appropriately removed. Thus, at an interface between the processing target wafer W and the support wafer S, a bonding region Aa where the oxide film F and the front surface Sa of the support wafer S and a non-bonding region Ab are formed. The non-bonding region Ab is located at an outside of the bonding region Aa in a diametrical direction. Since this non-bonding region Ab is provided, the peripheral portion We can be appropriately removed. Further, it is desirable that an outer end surface of the bonding region Aa is located slightly outer than an inner end portion of the peripheral portion We to be removed in the diametrical direction. Further, the non-bonding region Ab is formed by removing a peripheral portion of the oxide film F by performing grinding or wet etching before the processing target wafer W and the support wafer S are bonded. At this time, a center of the non-bonding region Ab (bonding region Aa) and a center of the processing target wafer W may be deviated. That is, a distance between an outer end portion of the processing target wafer W and an inner end portion of the non-bonding region Ab may not be uniform in a circumferential direction thereof.

Further, the processing target wafer W and the support wafer S are bonded as a so-called bonding wave caused by Van der Waals force and a hydrogen bond (intermolecular force) expands outwards from the center in the diametrical direction. At an end portion of the bonding wave, air is compressed to have a high pressure. If this high-pressure air is opened to the atmosphere at an outer end portion of the oxide film (outer end portion of the bonding region), the corresponding air is decompressed rapidly to the atmospheric pressure. Due to this rapid reduction in the pressure, Joule-Thomson effect occurs, resulting in a temperature decrease and a formation of a condensation. This condensation is trapped in a peripheral portion of the combined wafer T, ending up with becoming a void.

Meanwhile, in the present exemplary embodiment, a slope in which a thickness of the oxide film F decreases as it goes outwards in the diametrical direction is formed at a peripheral portion Fe of the oxide film F. By forming the slope at the peripheral portion Fe in this way, a space is gradually expanded at this peripheral portion Fe as it goes outwards in the diametrical direction. Accordingly, in the bonding, the high-pressure atmosphere at the end portion of the bonding wave is slowly decompressed to the atmospheric pressure as it goes outwards. That is, since the rapid reduction in the pressure can be suppressed, the void can be suppressed.

As depicted in FIG. 1, the wafer processing system 1 has a configuration in which a carry-in/out station 2 and a processing station 3 are connected as one body. In the carry-in/out station 2, a cassette Ct capable of accommodating therein a multiple number of combined wafers T is carried to/from, for example, an outside. The processing station 3 is equipped with various kinds of processing apparatuses configured to perform required processings on the combined wafers T.

A cassette placing table 10 is provided in the carry-in/out station 2. In the shown example, a plurality of, for example, three cassettes Ct can be arranged on the cassette placing table 10 in a row in the Y-axis direction. Further, the number of the cassettes Ct placed on the cassette placing table 10 is not limited to the example of the present exemplary embodiment, but can be selected as required.

In the carry-in/out station 2, a wafer transfer device 20 is provided adjacent to the cassette placing table 10 at a negative X-axis side of the cassette placing table 10. The wafer transfer device 20 is configured to be movable on a transfer path 21 which is elongated in the Y-axis direction. Further, the wafer transfer device 20 is equipped with, for example, two transfer arms 22 each of which is configured to hold and transfer the combined wafer T. Each transfer arm 22 is configured to be movable in a horizontal direction and a vertical direction and pivotable around a horizontal axis and a vertical axis. Further, the configuration of the transfer arm 22 is not limited to the exemplary embodiment, and various other configurations may be adopted. The wafer transfer device 20 is configured to be capable of transferring the combined wafer T to/from the cassette Ct of the cassette placing table 10 and a transition device 30 to be described later.

In the carry-in/out station 2, the transition device 30 configured to deliver the combined wafer T is provided adjacent to the wafer transfer device 20 at a negative X-axis side of the wafer transfer device 20.

The processing station 3 is provided with, for example, three processing blocks G1 to G3. The first processing block G1, the second processing block G2 and the third processing block G3 are arranged side by side in this sequence from a positive X-axis side (from a carry-in/out station 2 side) toward a negative X-axis side.

The first processing block G1 is equipped with an etching apparatus 40, a cleaning apparatus 41 and a wafer transfer device 50. The etching apparatus 40 and the cleaning apparatus 41 are stacked on top of each other. Further, the number and the layout of the etching apparatus 40 and the cleaning apparatus 41 are not limited to the shown example. By way of example, the etching apparatus 40 and the cleaning apparatus 41 may be elongated in the X-axis direction and arranged side by side when viewed from the top. Further, a plurality of etching apparatuses 40 and a plurality of cleaning apparatuses 41 may be respectively stacked on top of each other.

The etching apparatus 40 is configured to etch the rear surface Wb of the processing target wafer W grounded by a processing apparatus 80 to be described later. By way of example, by supplying a chemical liquid (etching liquid) onto the rear surface Wb, the rear surface Wb is wet-etched. For instance, HF, $HNO_3$, $H_3PO_4$, TMAH, Choline, KOH, or the like may be used as the chemical liquid. Further, if the rear surface Wb can be cleaned sufficiently by the cleaning apparatus 41, the etching apparatus 40 may be omitted.

The cleaning apparatus 41 is configured to clean the rear surface Wb of the processing target wafer W grounded by the processing apparatus 80 to be described later. By way of example, by bringing a brush into contact with the rear surface Wb, the rear surface Wb is cleaned by being scrubbed. Furthermore, a pressurized cleaning liquid may be used for the cleaning of the rear surface Wb. In addition, the cleaning apparatus 41 may be configured to clean the rear surface Sb of the support wafer S as well as the rear surface Wb of the processing target wafer W.

The wafer transfer device 50 is disposed at, for example, a negative Y-axis side of the etching apparatus 40 and the cleaning apparatus 41. The wafer transfer device 50 has, for example, two transfer arms 51 each of which is configured to hold and transfer the combined wafer T. Each transfer arm 51 is configured to be movable in the horizontal direction and the vertical direction, and pivotable around a horizontal axis and a vertical axis. Further, the configuration of the transfer arm 51 is not limited to the exemplary embodiment, and various other configurations may be adopted. Additionally, the wafer transfer device 50 is configured to be capable of transferring the combined wafer T to/from the transition apparatus 30, the etching apparatus 40, the cleaning apparatus 41 and a modifying apparatus 60 to be described later.

The second processing block G2 is equipped with the modifying apparatus 60, a periphery removing apparatus 61 and a wafer transfer device 70. The modifying apparatus 60 and the periphery removing apparatus 61 are stacked on top of each other. Further, the number and the layout of the modifying apparatus 60 and the periphery removing apparatus 61 is not limited to the example of the present exemplary embodiment.

The modifying apparatus 60 is configured to form a periphery modification layer by radiating laser light to an inside of the processing target wafer W. A specific configuration of the modifying apparatus 60 will be elaborated later.

The periphery removing apparatus 61 is configured to remove the peripheral portion We of the processing target wafer W, starting from the periphery modification layer formed by the modifying apparatus 60. Although the configuration of the periphery removing apparatus 61 is not particularly limited, it has, for example, an extensible tape (not shown). By attaching the tape to the rear surface Wb of the processing target wafer W and extending the tape in the diametrical direction of the processing target wafer W, the peripheral portion We is separated from the processing target wafer W, starting from the periphery modification layer.

Further, the way how to remove the peripheral portion We in the periphery removing apparatus 61 is not limited to the present exemplary embodiment. By way of example, the peripheral portion We may be removed by being hit by an air blow or a water jet. Alternatively, the peripheral portion We may be removed physically by bringing a jig such as pincette into contact with the peripheral portion We.

The wafer transfer device 70 is disposed at, for example, a positive Y-axis side of the modifying apparatus 60 and the periphery removing apparatus 61. The wafer transfer device 70 is equipped with, for example, two transfer arms 71 each of which is configured to hold and transfer the combined wafer T. As an example, the first transfer arm 71 holds the combined wafer T from below it, and the second transfer arm 71 holds the combined wafer T from above it. Each transfer arm 71 is supported at a multi-joint arm member 72 and configured to be movable in the horizontal direction and the vertical direction, and pivotable around a horizontal axis and a vertical axis. Furthermore, the configuration of the transfer arm 71 is not limited to the present exemplary embodiment, and various other configurations may be adopted. The wafer transfer device 70 is configured to be capable of transferring the combined wafer T to/from the cleaning apparatus 41, the modifying apparatus 60, the periphery removing apparatus 61 and the processing apparatus 80 to be described later.

The third processing block G3 is equipped with the processing apparatus 80. The number and the layout of the processing apparatus 80 is not limited to the present exemplary embodiment, and a plurality of processing apparatuses 80 may be arranged as required.

The processing apparatus 80 is configured to grind the rear surface Wb of the processing target wafer W. The processing apparatus 80 includes a rotary table 90, a rough grinding unit 100, an intermediate grinding unit 110 and a finishing grinding unit 120.

The rotary table 90 is configured to be rotated around a vertical rotation center line 91 by a rotating mechanism (not shown). Four chucks 92 each configured to attract and hold the combined wafer T are provided on the rotary table 90. The chucks 92 are arranged on a circle concentric with the rotary table 92 at a regular distance therebetween, that is, at an angular distance of 90 degrees therebetween. The four chucks 92 are configured to be moved to a delivery position A0 and processing positions A1 to A3 as the rotary table 90 is rotated. Further, each of the chucks 92 is configured to be rotated around a vertical axis by a rotating mechanism (not shown).

In the present exemplary embodiment, the delivery position A0 is a position at a positive X-axis and positive Y-axis side of the rotary table 90. The first processing position A1 is a position at a negative X-axis and positive Y-axis side of the rotary table 90, and the rough grinding unit 100 is disposed thereat. The second processing position A2 is a position at a negative X-axis and negative Y-axis side of the rotary table 90, and the intermediate grinding unit 110 is disposed thereat. The third processing position A3 is a position at a positive X-axis and negative Y-axis side of the rotary table 90, and the finishing grinding unit 120 is disposed thereat.

In the rough grinding unit 100, the rear surface Wb of the processing target wafer W is roughly ground. The rough grinding unit 100 is equipped with a rough grinder 101 having a rough grinding whetstone (not shown) configured to be rotated in a ring shape. Further, the rough grinder 101 is configured to be moved in a vertical direction along a supporting column 102. By respectively rotating the chuck 92 and the rough grinding whetstone while keeping the rear surface Wb of the processing target wafer W held by the chuck 92 in contact with the rough grinding whetstone, the rear surface Wb is roughly ground.

In the intermediate grinding unit 110, the rear surface Wb of the processing target wafer W is ground to an intermediate level. The intermediate grinding unit 110 includes an intermediate grinder 111 equipped with an intermediate grinding whetstone (not shown) configured to be rotated in a ring shape. Further, the intermediate grinder 111 is configure to be movable in a vertical direction along a supporting column 112. Furthermore, a particle size of abrasive grains of the intermediate grinding whetstone is smaller than a particle size of abrasive grains of the rough grinding whetstone. By respectively rotating the chuck 92 and the intermediate grinding whetstone while keeping the rear surface Wb of the processing target wafer W held by the chuck 92 in contact with the intermediate grinding whetstone, the rear surface Wb is ground to the intermediate level.

In the finishing grinding unit 120, the rear surface Wb of the processing target wafer W is ground finely. The finishing grinding unit 120 includes a finishing grinder 121 equipped with a finishing grinding whetstone (not shown) configured to be rotated in a ring shape. The finishing grinder 121 is configured to be movable in a vertical direction along a supporting column 122. Further, a particle size of abrasive grains of the finishing grinding whetstone is smaller than the particle size of the abrasive grains of the intermediate grinding whetstone. By respectively rotating the chuck 92 and the finishing grinding whetstone while keeping the rear surface Wb of the processing target wafer W held by the chuck 92 in contact with the finishing grinding whetstone, the rear surface Wb is finely ground.

The above-described wafer processing system 1 is equipped with a control device 130. The control device 130 is implemented by, for example, a computer, and includes a program storage (not shown). A program for controlling a processing of the combined wafer T in the wafer processing system 1 is stored in the program storage. Further, the program storage also stores therein a program for implementing a substrate processing to be described later in the wafer processing system 1 by controlling the above-described various processing apparatuses and a driving system such as the transfer devices. Further, the program may be recorded in a computer-readable recording medium H, and may be installed from this recording medium H to the control device 130.

Figure 4:
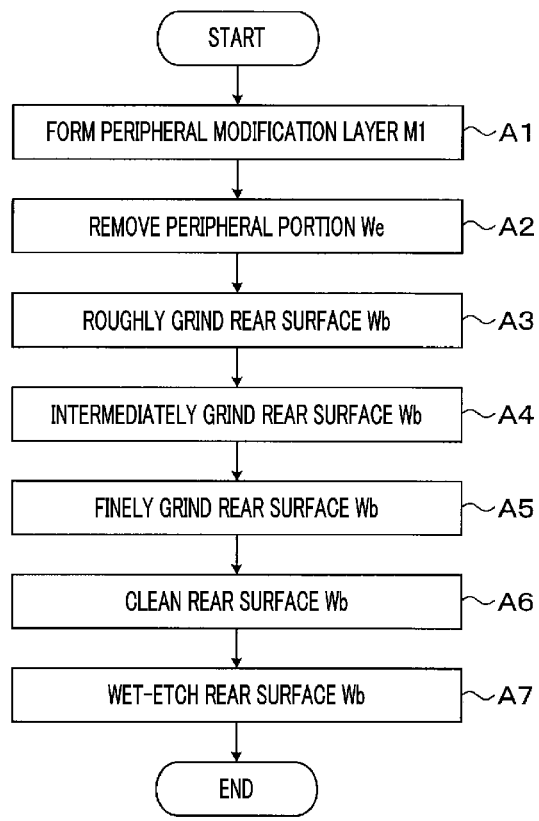
FIG. 4 is a flowchart illustrating main processes of a wafer processing.

Now, a wafer processing performed by using the wafer processing system 1 having the above-described configuration will be described. FIG. 4 is a flowchart illustrating main processes of the wafer processing. FIG. 5A to FIG. 5D are explanatory diagrams illustrating the main processes of the wafer processing. Further, in the present exemplary embodiment, the combined wafer T is previously formed by bonding the processing target wafer W and the support wafer S by in the bonding apparatus (not shown) which is provided at the outside of the wafer processing system 1.

Figure 5A:
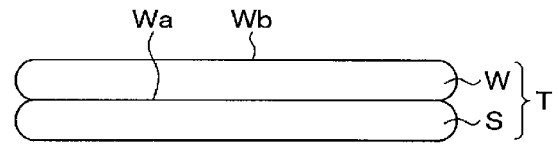
FIG. 5A to FIG. 5D are explanatory diagrams illustrating the main processes of the wafer processing.

First, a cassette Ct accommodating therein a multiple number of combined wafers T is placed on the cassette placing table 10 of the carry-in/out station 2, as shown in FIG. 5A.

Figure 5B:
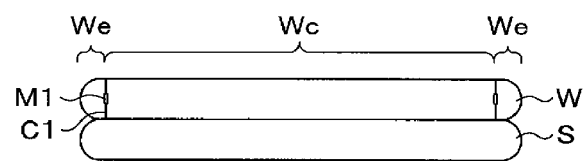

Then, the combined wafer T is taken out of the cassette Ct by the wafer transfer device 20, and transferred into the transition device 30. Subsequently, the combined wafer T is taken out of the transition device 30 by the wafer transfer device 50, and transferred into the modifying apparatus 60. In the modifying apparatus 60, a peripheral modification layer M1 is formed within the processing target wafer W, as illustrated in FIG. 5B (process A1 of FIG. 4). To elaborate, in the modifying apparatus 60, by radiating laser light from a laser head to be described later while rotating the processing target wafer W (combined wafer T), the peripheral modification layer M1 is formed at a boundary between a peripheral portion We and a central portion Wc of the processing target wafer W.

Figure 6:
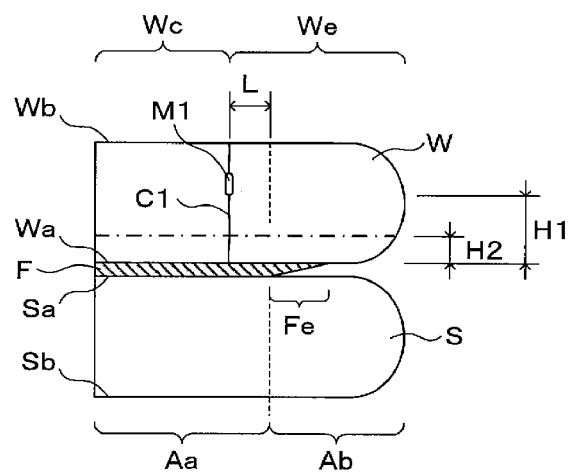
FIG. 6 is a longitudinal cross sectional view illustrating a state in which a peripheral modification layer is formed in a processing target wafer.
Figure 7:
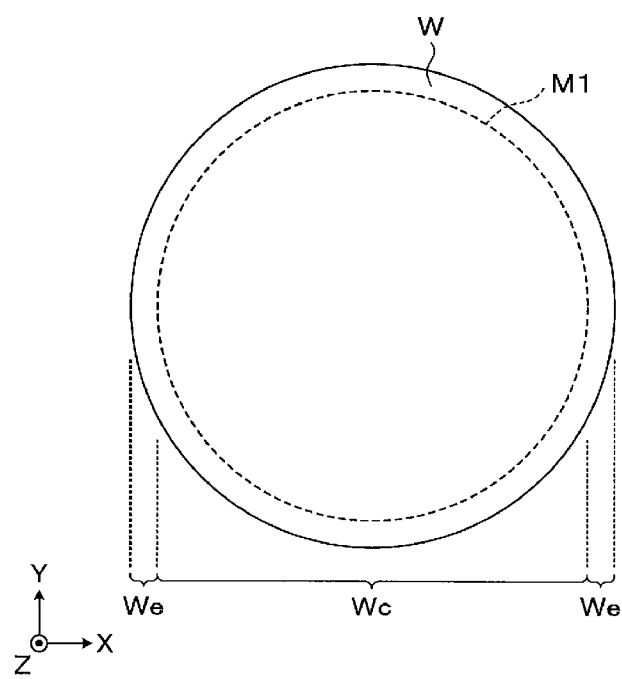
FIG. 7 is a plan view illustrating the state in which the peripheral modification layer is formed in the processing target wafer.

The peripheral modification layer M1 serves as a starting point when the peripheral portion We is removed in the edge trimming. As depicted in FIG. 6 and FIG. 7, the modification layer M1 is formed to have a ring shape along the boundary between the peripheral portion We of the processing target wafer W to be removed and the central portion Wc thereof. Further, the peripheral portion We is in a range from, e.g., 1 mm to 5 mm from an edge of the processing target wafer W in a diametrical direction, and includes a chamfered portion.

Further, the peripheral modification layer M1 is formed at an inner side than an outer end portion of a bonding region Aa in the diametrical direction. Even if the peripheral modification layer M1 is formed while being deviated from the outer end portion of the bonding region Aa due to, for example, a processing error or the like when the peripheral modification layer M1 is formed by the laser light from the laser head, the peripheral modification layer Ma can be suppressed from being formed at an outer side than the outer end portion of the bonding region Aa in the diametrical direction. Here, if the peripheral modification layer M1 is formed at the outer side than the outer end portion of the bonding region Aa in the diametrical direction, the processing target wafer W may not be firmly bonded to the support wafer S after the peripheral portion We is removed. In the present exemplary embodiment, however, this state of the processing target wafer W can be certainly suppressed.

Further, the present inventors have conducted researches and found out that the peripheral portion We can be appropriately removed if a distance L between the peripheral modification layer M1 and the outer end portion of the bonding region Aa is sufficiently small. This distance is desirably within 500 µm and, more desirably, within 50 µm.

Further, the peripheral modification layer M1 is elongated in a thickness direction and has an aspect ratio with a vertically longer side. A lower end of the peripheral modification layer M1 is located above a target surface (indicated by a dashed line in FIG. 6) of the processing target wafer W after being ground. That is, a distance H1 between the lower end of the peripheral modification layer M1 and the front surface Wa of the processing target wafer W is larger than a target thickness H2 of the processing target wafer W after being ground. In this case, the peripheral modification layer M1 does not remain in the processing target wafer W after being ground.

Within the processing target wafer W, a crack C1 develops from the peripheral modification layer M1 and reaches the front surface Wa and the rear surface Wb. Further, the peripheral modification layers M1 may be plural in number, and these multiple peripheral modification layers M1 may be formed in the plate thickness direction.

Figure 5C:
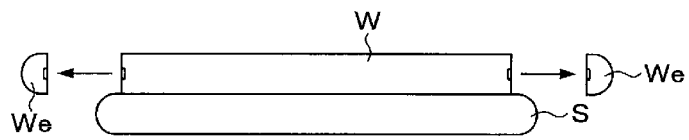

Subsequently, the combined wafer T is transferred into the periphery removing apparatus 61 by the wafer transfer device 70. In the periphery removing apparatus 61, the peripheral portion We of the processing target wafer W is removed starting from the peripheral modification layer M1, as illustrated in FIG. 5C (process A2 of FIG. 4).

Figure 5D:
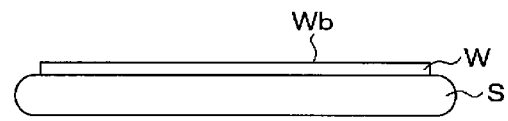

Then, the combined wafer T is transferred into the processing apparatus 80 by the wafer transfer device 70. The combined wafer T transferred into the processing apparatus 80 is then delivered onto the chuck 92 at the delivery position A0. Thereafter, the chuck 92 is moved to the first processing position A1. Then, the rear surface Wb of the processing target wafer W is roughly ground by the rough grinding unit 100, as illustrated in FIG. 5D (process A3 of FIG. 4).

Next, the chuck 92 is moved to the second processing position A2. The rear surface Wb of the processing target wafer W is ground to the intermediate level by the intermediate grinding unit 110 (process A4 of FIG. 4).

Afterwards, the chuck 92 is moved to the third processing position A3. The rear surface Wb of the processing target wafer W is finely ground by the finishing grinding unit 120 (process A5 of FIG. 4).

Then, the chuck 92 is moved to the delivery position A0. At the delivery position A0, the rear surface Wb of the processing target wafer W may be cleaned with a cleaning liquid by using a cleaning liquid nozzle (not shown).

Subsequently, the combined wafer T is transferred to the cleaning apparatus 41 by the wafer transfer device 70. In the cleaning apparatus 41, the ground rear surface Wb of the processing target wafer W is cleaned by being scrubbed (process A6 of FIG. 4). Further, in the cleaning apparatus 41, the rear surface Sb of the support wafer S as well as the rear surface Wb of the processing target wafer W may be cleaned.

Thereafter, the combined wafer T is transferred to the etching apparatus 40 by the wafer transfer device 50. In the etching apparatus 40, the rear surface Wb of the processing target wafer W is wet-etched by the chemical liquid (process A7 of FIG. 4). A grinding mark may be formed on the rear surface Wb ground by the aforementioned processing apparatus 80. In the process A7, the grinding mark can be removed by performing the wet-etching, so that the rear surface Wb can be flattened.

Then, the combined wafer T after being subjected to all the required processings is transferred to the transition device 30 by the wafer transfer device 50, and then transferred into the cassette Ct on the cassette placing table 10 by the wafer transfer device 20. Accordingly, a series of the processes of the wafer processing in the wafer processing system 1 is ended.

Figure 8:
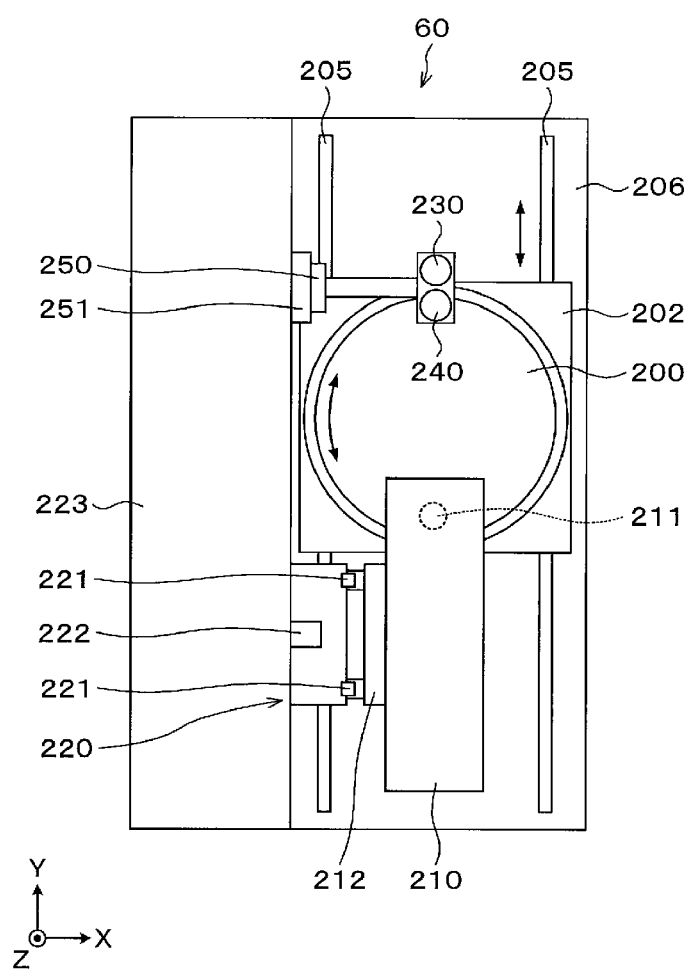
FIG. 8 is a plan view illustrating a schematic configuration of a modifying apparatus according to the present exemplary embodiment.
Figure 9:
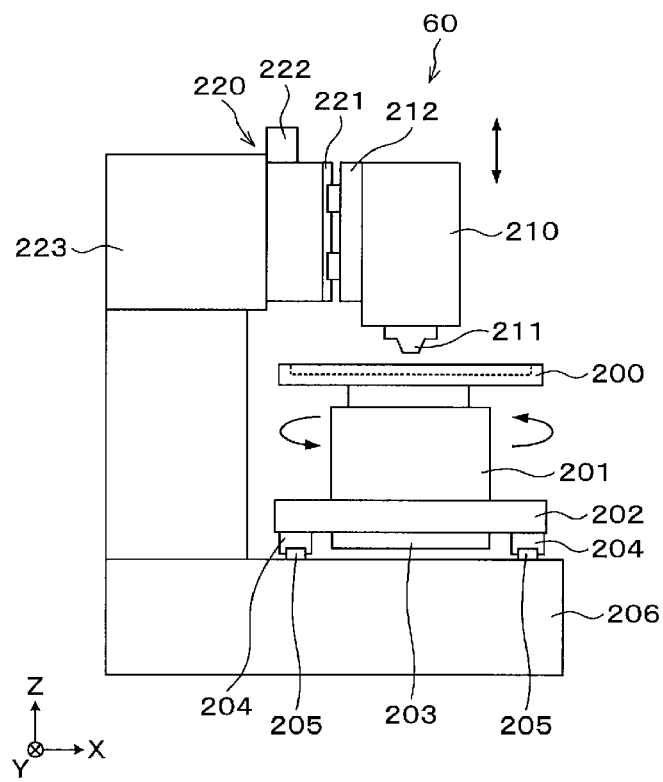
FIG. 9 is a side view illustrating the schematic configuration of the modifying apparatus according to the present exemplary embodiment.

Now, the aforementioned modifying apparatus 60 will be explained. FIG. 8 is a plan view schematically illustrating a configuration of the modifying apparatus 60. FIG. 9 is a side view schematically illustrating the configuration of the modifying apparatus 60.

The modifying apparatus 60 has a chuck 200 as a holder configured to attract and hold the combined wafer W on a top surface thereof. The chuck 200 is supported on a slider table 202 with an air bearing 201 therebetween. A rotator 203 is provided at a bottom surface side of the slider table 202. The rotator 203 incorporates therein, for example, a motor as a driving source. The chuck 200 is configured to be rotated around a vertical axis by the rotator 203 via the air bearing 201. The slider table 202 is configured to be moved by a horizontally moving mechanism 204, which is provided at a bottom surface side thereof, along a rail 205 which is provided at a base 206 and elongated in the Y-axis direction. Further, in the present exemplary embodiment, the rotator 203 and the horizontally moving mechanism 204 constitute a holder moving mechanism. Further, though not particularly limited, a driving source of the horizontally moving mechanism 204 may be, for example, a linear motor.

A laser head 210 as a periphery removing device is provided above the chuck 200. The laser head 210 has a lens 211. The lens 211 is a cylindrical member provided on a bottom surface of the laser head 210, and is configured to radiate the laser light to the processing target wafer W held by the chuck 200.

The laser head 210 concentrates and irradiates the laser light having a wavelength featuring transmissivity for the processing target wafer W to a required position within the processing target wafer W as high-frequency laser light in a pulse shape oscillated from a laser light oscillator (not shown). Accordingly, a portion within the processing target wafer W to which the laser light is concentrated is modified, so that the aforementioned peripheral modification layer M1 is formed.

The laser head 210 is configured to be moved up and down in the vertical direction by an elevating unit 220 with a supporting member 212 therebetween. The elevating unit 220 includes a vertically elongated rail 221; and a driving mechanism 222 configured to move the supporting member 212 (laser head 210) up and down along the rail 221. Further, the elevating unit 220 is supported at a supporting column 223.

Above the chuck 200, a macro-camera 230 as a first imaging device (first detector) and a micro-camera 240 as a second imaging device (second detector) are provided at a positive Y-axis side of the laser head 210. For example, the macro-camera 230 and the micro-camera 240 are formed as one body, and the macro-camera 230 is provided at a positive Y-axis side of the micro-camera 240. The macro-camera 230 and the micro-camera 240 are configured to be moved up and down by an elevating mechanism 250, and also configured to be moved in the Y-axis direction by a moving mechanism 251. Further, in the present exemplary embodiment, this moving mechanism serves as a detector moving mechanism.

Figure 10:
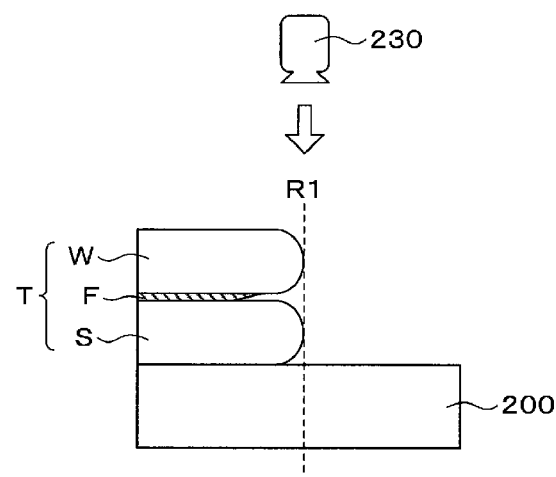
FIG. 10 is an explanatory diagram illustrating a portion an image of which is taken by a macro-camera.

As depicted in FIG. 10, the macro-camera 230 images (detects) an outer end portion R1 (indicated by a dashed line in FIG. 10) of the processing target wafer W (combined wafer T). The macro-camera 230 is equipped with, for example, a coaxial lens, and radiates visible light, for example, red light and receives reflection light from a target object. Although the visible light is reflected on the rear surface Wb of the processing target wafer W, it is absorbed into the chuck 200. For the reason, in the image obtained by the macro-camera 230, the processing target wafer W is seen white, whereas the chuck 200 is seen black. For example, the macro-camera 230 has an image magnification of two times.

Figure 11:
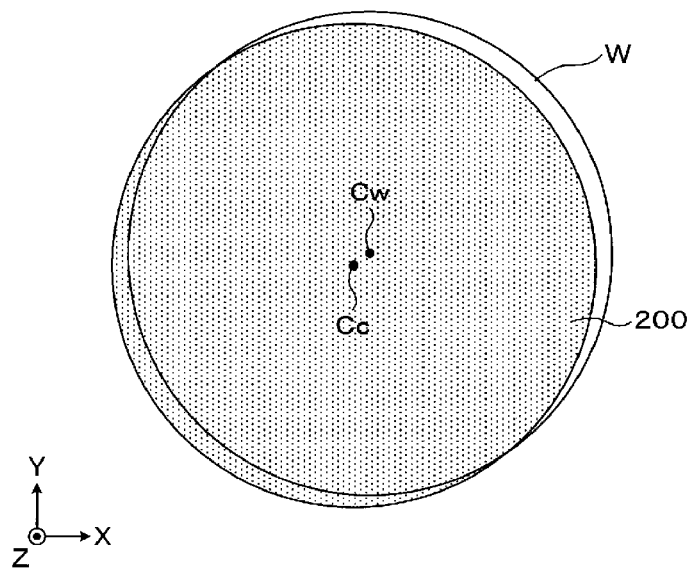
FIG. 11 is an explanatory diagram illustrating a first eccentric amount calculated from macro-alignment.

The image obtained by the macro-camera 230 is outputted to the control device 130. In the control device 130, a first eccentric amount between a center Cc of the chuck 200 and a center Cw of the processing target wafer W, as illustrated in FIG. 11, is calculated from the image obtained by the macro-camera 230.

Figure 12:
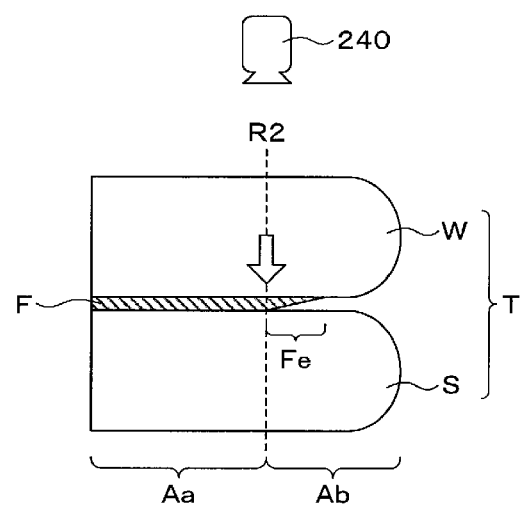
FIG. 12 is an explanatory diagram illustrating a portion an image of which is taken by a micro-camera.

Referring to FIG. 12, the micro-camera 240 images a peripheral portion of the processing target wafer W and images a boundary R2 (indicated by a dashed line in FIG. 12) between the bonding region Aa and the non-bonding region Ab. The micro-camera 240 is equipped with, for example, a coaxial lens, and radiates infrared light (IR light) and receives reflection light from a target object. By way of example, the micro-camera 240 has an image magnification of 10 times. A field of view of the micro-camera 240 is about ⅕ of a field of view of the macro-camera 230, and a pixel size of the micro-cameral 240 is about ⅕ of a pixel size of the macro-camera 230.

Figure 13:
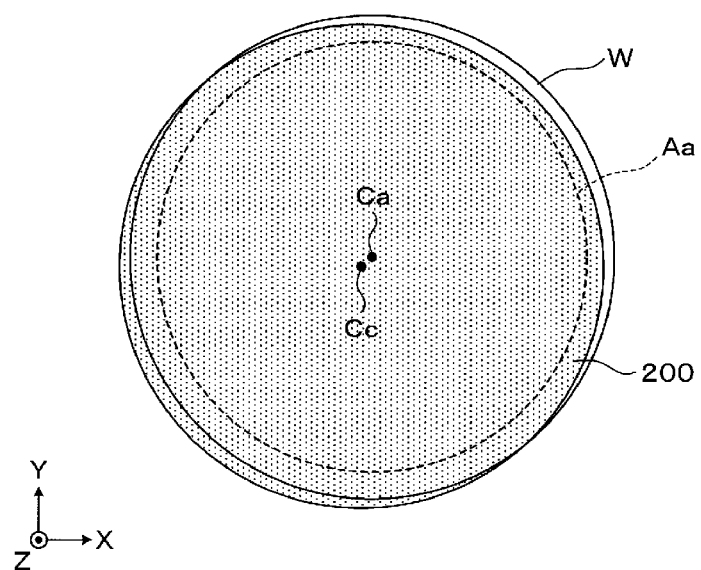
FIG. 13 is an explanatory diagram illustrating a first eccentric amount calculated from micro-alignment.

An image obtained by the micro-camera 240 is outputted to the control device 130. In the control device 130, a second eccentric amount between the center Cc of the chuck 200 and a center Ca of the bonding region Aa as shown in FIG. 13 is calculated from the image obtained by the micro-camera 240.

Figure 14:
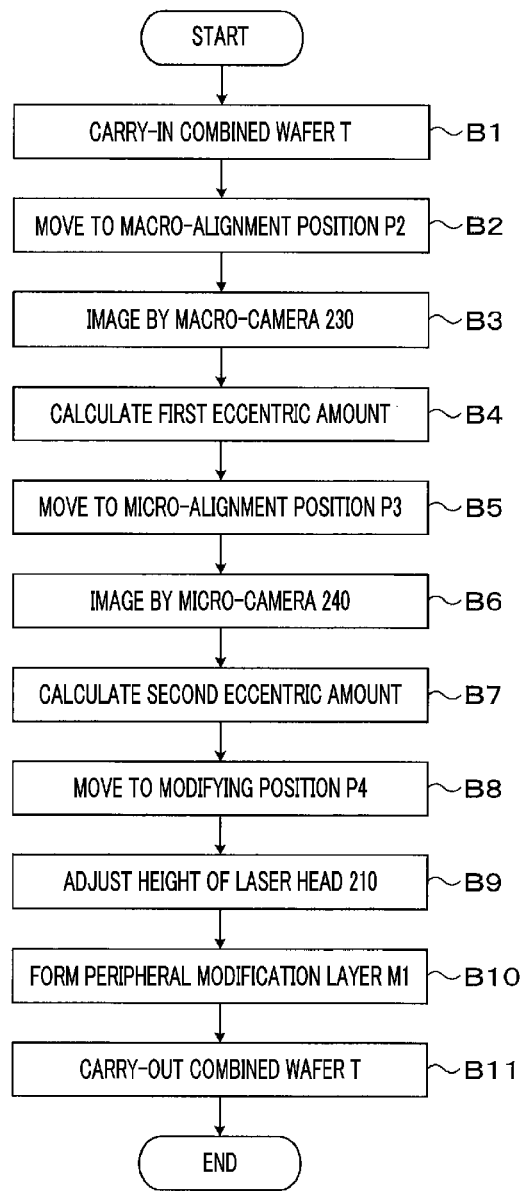
FIG. 14 is a flowchart illustrating main processes of a modifying processing.

Now, a modifying processing performed by using the modifying apparatus 60 having the above-described configuration will be explained. FIG. 14 is a flowchart illustrating main processes of the modifying processing. FIG. 15A to FIG. 15E are explanatory diagrams illustrating the main processes of the modifying processing.

Figure 15A:
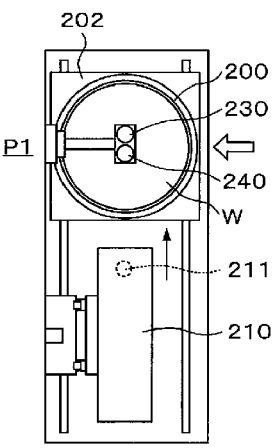
FIG. 15A to FIG. 15E are explanatory diagrams illustrating the main processes of the modifying processing.

First, as depicted in FIG. 15A, the chuck 200 (slider table 202) is moved to a carry-in/out position P1. The combined wafer T is carried in from the wafer transfer device 50, and held by the chuck 200 (process B1 of FIG. 14).

Figure 15B:
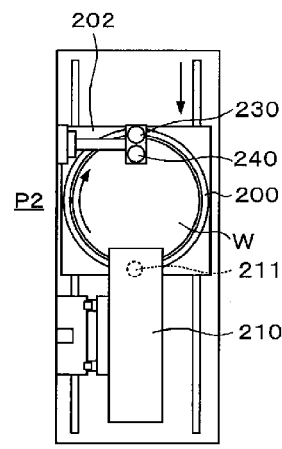

Then, as shown in FIG. 15B, the chuck 200 is moved to a macro-alignment position P2 (process B2 of FIG. 14). The macro-alignment position P2 is a position where the macro-camera 230 is capable of imaging the outer end portion R1 of the processing target wafer W. Further, in the process B2, a height of the macro-camera 230 is adjusted.

Subsequently, the outer end portion R1 of the processing target wafer W is imaged by the macro-camera 230 (process B3 of FIG. 14). In this process B3, the chuck 200 is not moved in the Y-axis direction but fixed. Meanwhile, the chuck 200 is rotated by the rotator 203. Accordingly, the image of the outer end portion R1 is obtained by the macro-camera 230 in 360 degrees in a circumferential direction of the processing target wafer W. The obtained image is outputted to the control device 130 from the macro-camera 230.

Figure 16:
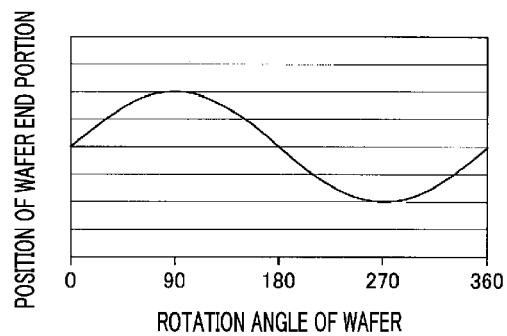
FIG. 16 is an explanatory diagram showing a relationship between a rotation angle of the processing target wafer and a position of an outer end portion of the processing target wafer.

In the control device 130, the first eccentric amount between the center Cc of the chuck 200 and the center Cw of the processing target wafer W is calculated from the image obtained by the macro-camera 230 (process B4 of FIG. 14). To elaborate, a position (vertical axis of FIG. 16) of the outer end portion of the processing target wafer W with respect to a rotation angle (horizontal axis of FIG. 16) of the processing target wafer W is obtained from the image by the macro-camera 230, as shown in FIG. 16. Thus, a position of the center Cw of the processing target wafer W can be calculated, and the first eccentric amount can be calculated.

Figure 15C:
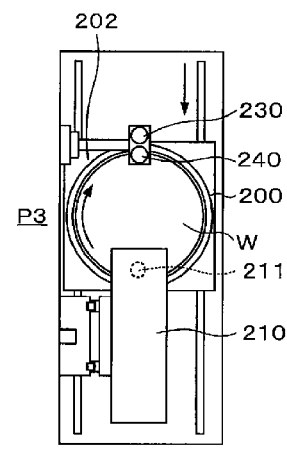

Further, in the control device 130, a moving amount of the chuck 200 is calculated based on the first eccentric amount to correct a Y-axis component of the first eccentric amount. The chuck 200 is moved in the Y-axis direction based on this calculated moving amount, and the chuck 200 is moved to a micro-alignment position P3, as shown in FIG. 15C (process B5 of FIG. 14). The micro-alignment position P3 is a position where the micro-camera 240 is capable of imaging the peripheral portion of the processing target wafer W. Here, since the field of view of the micro-camera 240 is smaller (about ⅕) than the field of view of the macro-camera 230 as stated above, the peripheral portion of the processing target wafer W may be not included within an angle of view of the micro-camera 240, resulting in a failure to image the peripheral portion of the processing target wafer W with the micro-camera 240. For the reason, the correction of the Y-axis component based on the first eccentric amount in the process B5 is performed to move the chuck 200 to the micro-alignment position P3. Further, in the process B5, a height of the micro-camera 240 is adjusted.

Subsequently, the boundary R2 between the bonding region Aa and the non-bonding region Ab is imaged by the micro-camera 240 (process B6 of FIG. 14). In this process B6, the moving and the rotating of the chuck 200 have the following two patterns.

As the first pattern, the first eccentric amount calculated in the process B4 does not have an X-axis component. In this case, since the Y-axis component of the first eccentric amount is corrected when the chuck 200 is moved in the Y-axis direction in the process B5, the chuck 200 is not moved in the Y-axis direction but fixed in the process B6. While rotating the chuck 200 with the rotator 203, the peripheral portion of the processing target wafer W is imaged by the micro-camera 240. Accordingly, the boundary R2 between the bonding region Aa and the non-bonding region Ab is imaged in 360 degrees in the circumferential direction of the processing target wafer W. The obtained image is outputted to the control device 130 from the micro-camera 240.

As the second pattern, the first eccentric amount calculated in the process B4 has an X-axis component. In this case, in the process B6, the chuck 200 is rotated by the rotator 203 to correct the X-axis component of the first eccentric amount, and the chuck 200 is moved in the Y-axis direction by the horizontally moving mechanism 204. At this time, the rotating of the chuck 200 and the moving of the chuck 200 in the Y-axis direction are synchronized. While rotating and moving the chuck 200 as described above, the peripheral portion of the processing target wafer W is imaged by the micro-camera 240. Accordingly, the boundary R2 between the bonding region Aa and the non-bonding region Ab is imaged in 360 degrees in the circumferential direction of the processing target wafer W. The obtained image is outputted to the control device 130 from the micro-camera 240.

Figure 17:
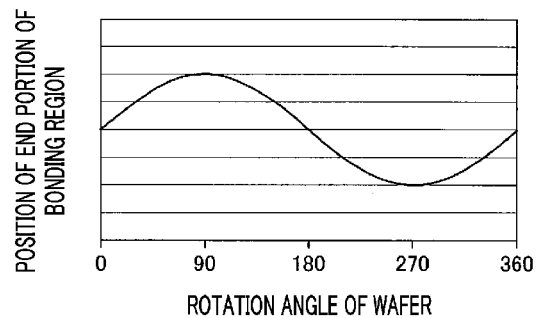
FIG. 17 is an explanatory diagram showing a relationship between the rotation angle of the processing target wafer and an outer end portion of a bonding region.

In the control device 130, the second eccentric amount between the center Cc of the chuck 200 and the center Ca of the bonding region Aa is calculated from the image by the micro-camera 240 (process B7 of FIG. 14). To elaborate, a position of the outer end portion of the bonding region Aa (vertical axis of FIG. 17) with respect to a rotation angle (horizontal axis of FIG. 17) of the processing target wafer W is acquired from the image of the micro-camera 240, as depicted in FIG. 17. Then, a position of the center Ca of the bonding region Aa can be calculated, and the second eccentric amount can also be calculated.

Further, in the control device 130, a position of the chuck 200 with respect to the peripheral modification layer M1 is decided based on the second eccentric amount such that the center of the bonding region Aa and the center of the peripheral modification layer M1 (peripheral portion We) are coincident with each other. To elaborate, the position of the chuck 200 is determined to be on the curve shown in FIG. 17. Here, as stated above, though the non-bonding region Ab is formed before the processing target wafer W and the support wafer S are bonded, the center of this non-bonding region Ab (center Ca of the bonding region Aa) and the center of the processing target wafer W may be deviated. In the present exemplary embodiment, however, by adjusting the position of the chuck 200 with respect to the peripheral modification layer M1 based on the second eccentric amount, the deviation of the non-bonding region Ab is corrected.

Figure 15D:
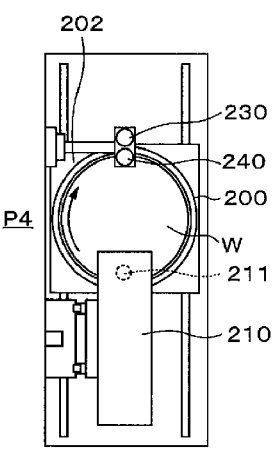

Subsequently, the chuck 200 is moved to a modifying position P4 as a removing position, as shown in FIG. 15D (process B8 of FIG. 14). The modifying position P4 is a position where the laser head 210 radiates the laser light to the processing target wafer W to thereby form the peripheral modification layer M1. Further, in the present exemplary embodiment, the modifying position P4 is the same as the micro-alignment position P3, and the chuck 200 is not substantially moved in the process B8.

Thereafter, at the modifying position P4, a height of the rear surface Wb of the processing target wafer W held by the chuck 200 is detected, and a height of the laser head 210 is adjusted based on the detection result (process B9 of FIG. 14). The height of the laser head 210 is adjusted to allow the peripheral modification layer M1 to be formed at a required height, as shown in FIG. 6.

Then, if the laser light is radiated to the inside of the processing target wafer W from the laser head 210, the peripheral modification layer M1 is formed (process 1310 of FIG. 14). Here, in the control device 130, the position of the chuck 200 is determined based on the second eccentric amount such that the position the chuck 200 accords to the curve of FIG. 17, as stated above. In the process 1310, based on the determined position of the chuck 200, the chuck 200 is rotated by the rotator 203 and moved in the Y-axis direction by the horizontally moving mechanism 204 such that the center of the bonding region Aa and the center of the peripheral modification layer M1 are coincident. At this time, the rotating of the chuck 200 and the moving of the chuck 200 in the Y-axis direction are synchronized. In this way, by performing the completely synchronized control, the moving of the chuck 200 can follow the determined position appropriately with little error.

While rotating and moving the chuck 200 as stated above, the laser light is radiated to the inside of the processing target wafer W from the laser head 210. That is, while correcting the second eccentric amount, the peripheral modification layer M1 is formed. The peripheral modification layer M1 is formed in a ring shape concentric with the bonding region Aa. That is, the distance L between the peripheral modification layer M1 and the outer end portion of the bonding region Aa shown in FIG. 6 can be made constant. Thus, in the periphery removing apparatus 61, the peripheral portion We can be appropriately removed, starting from the peripheral modification layer M1.

Further, in the present exemplary embodiment, the micro-alignment position P3 and the modifying position 4 are same. At this position, the micro-camera 240 is disposed at a positive Y-axis side of the processing target wafer W held by the chuck 200, and the lens 211 of the laser head 210 is located at a negative Y-axis side thereof. In this case, the peripheral modification layer M1 is formed by the laser head 210 and the peripheral modification layer M1 is imaged by the micro-camera 240 in the process 1310. The obtained image is outputted to the control device 130, and it is inspected in the control device 130 whether the peripheral modification layer M1 is formed at an appropriate position. In this way, by performing the formation and the inspection of the peripheral modification layer M1 in parallel, work efficiency can be improved. Further, if it is found out from the inspection result that the peripheral modification layer M1 is deviated from the required position, the moving of the chuck 200 can be finely adjusted.

Moreover, in case of performing the formation and the inspection of the peripheral modification layer M1 in parallel when the micro-alignment position P3 and the modifying position P4 are different, for example, the micro-camera 240 only needs to be moved to a required position in the Y-axis direction. Further, when a width of the edge trimming varies, that is, when a width of the peripheral portion We varies, the micro-camera 240 needs to be moved in the Y-axis direction as well. Furthermore, when the height at which the peripheral modification layer M1 is formed changes, the height of the micro-camera 240 needs to be adjusted such that the micro-camera 240 focuses on the peripheral modification layer M1.

Figure 15E:
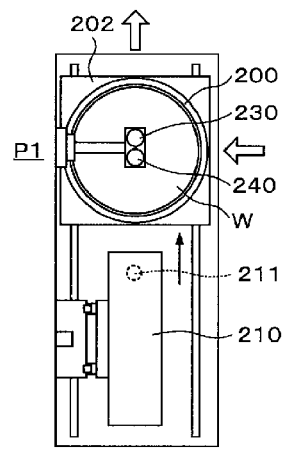
Figure 15E:
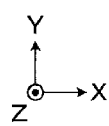

Subsequently, the chuck 200 is moved to the carry-in/out position P1, as shown in FIG. 15E. Then, the combined wafer T is carried out by the wafer transfer device 70 (process B11 of FIG. 14). Accordingly, a series of processes of the modifying processing in the modifying apparatus 60 is ended. Further, in the process B11, a combined wafer T to be subjected to the modifying processing next is carried in.

According to the above-described exemplary embodiment, by performing the two-stage alignment including the macro-alignment by the macro-camera 230 and the micro-alignment by the micro-camera 240, the position of the boundary R2 between the bonding region Aa and the non-bonding region Ab can be detected accurately. Thus, the peripheral modification layer M1 can be appropriately formed within the processing target wafer W, and, as a result, the peripheral portion We can be removed appropriately.

Figure 18:
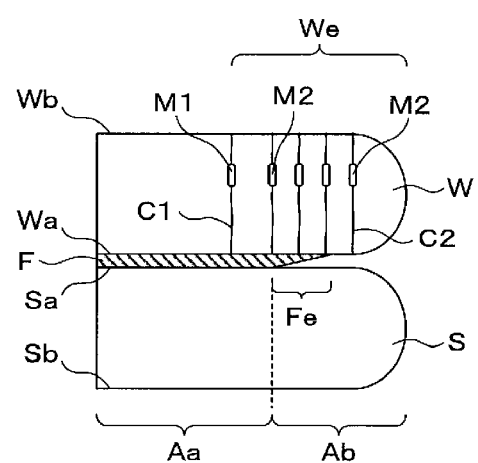
FIG. 18 is a longitudinal cross sectional view illustrating a state in which the peripheral modification layer and split modification layers are formed in the processing target wafer.

Further, in the modifying apparatus 60 according to the above-described exemplary embodiment, the peripheral modification layer M1 is formed in the ring shape within the processing target wafer W in the process 1310. However, a plurality of split modification layers M2 extending outwards from the peripheral modification layer M1 in the diametrical direction may be formed, as depicted in FIG. 18 and FIG. 19.

In the modifying apparatus 60, after the peripheral modification layer M1 is formed, the split modification layers M2 are formed by radiating the laser light to the inside of the processing target wafer W from the laser head 210 while moving the chuck 200 in the Y-axis direction. Each modification layer M2 is elongated in the thickness direction and has an aspect ratio with a vertically longer side, the same as the peripheral modification layer M1. Further, a crack C2 develops from the split modification layer M2 and reaches the front surface Wa and the rear surface Wb.

Here, as shown in FIG. 17, the position of the outer end portion of the bonding region Aa differs depending on the rotation angle of the processing target wafer W. Accordingly, a length of the split modification layer M2 differs depending on the rotation angle of the processing target wafer W. Thus, in the control device 130, a position of a starting point from which the split modification layer M2 is formed (that is, a position of the peripheral modification layer M1) is decided based on the second eccentric amount calculated in the process B7, and the length of the split modification layer M2 is corrected. To elaborate, the length of the split modification layer M2 is corrected to accord to the curve shown in FIG. 17.

By forming the multiple split modification layers M2 and cracks C2 at a pitch of several micrometers (μm) in the diametrical direction, a single-line split modification layer M2 elongated outwards from the peripheral modification layer M1 in the diametrical direction is formed, as shown in FIG. 19. Further, in the shown example, this single-line split modification layer M2 elongated in the diametrical direction is formed at each of eight different positions. However, the number of the split modification layers M2 is not particularly limited. As long as the split modification layers M2 are formed at two positions at least, the peripheral portion We can be removed. In this case, when removing the peripheral portion We in the edge trimming, this peripheral portion We is separated starting from the ring-shaped peripheral modification layer M1 to be divided by the split modification layers M2 into multiple pieces. As a result, the peripheral portion We to be removed is broken into smaller pieces, and, thus, it can be removed more easily.

Further, in the above-described exemplary embodiment, though the processing target wafer W is ground to be thinned after the peripheral portion We of the processing target wafer W is removed, the way how to thin the processing target wafer W is not limited thereto. As will be described later, the processing target wafer W may be separated starting from an internal modification layer M3. Further, the removing of the peripheral portion We and the thinning of the processing target wafer W may be carried out at the same time.

By way of example, as shown in FIG. 20A, the ring-shaped peripheral modification layer M1 is formed within the processing target wafer W, and the internal modification layer M3 is formed along a plane direction of the processing target wafer W in the process B10. At this time, an upper end of the peripheral modification layer M1 is substantially on a level with a height where the internal modification layer M3 is formed. Further, the internal modification layer M3 is formed by radiating the laser light to the inside of the processing target wafer W, the same as the peripheral modification layer M1. A sequence of forming the peripheral modification layer M1 and the internal modification layer M3 is not particularly limited.

Thereafter, as depicted in FIG. 20B, the rear surface Wb side of the processing target wafer W is removed starting from the peripheral modification layer M1 and the internal modification layer M3. In this way, by separating the rear surface Wb side starting from the internal modification layer M3, the processing target wafer W can be thinned. Further, the peripheral portion We is removed as a single body along with the rear surface Wb side of the processing target wafer W.

In this case, since the removing of the peripheral portion We and the thinning of the processing target wafer W are performed at the same time, a throughput of the wafer processing can be further improved. Further, since the processing target wafer W is thinned through the separation starting from the internal modification layer M3, a grinding residue is not produced and a grinding tool which is a consumable need not be prepared, as compared to the case of grinding the processing target wafer W. Thus, an apparatus configuration can be simplified.

It should be noted that the exemplary embodiment is illustrative in all aspects and is not anyway limiting. The above-described exemplary embodiment may be omitted, replaced and modified in various ways without departing from the scope and the spirit of claims.

By way of example, though the above exemplary embodiment has been described for the case where the substrate processing apparatus of the present disclosure is the modifying apparatus 60, the exemplary embodiment can also be applied to a case where the substrate processing apparatus is the periphery removing apparatus. That is, the exemplary embodiment may also be applicable to a case of removing the peripheral portion We of the processing target wafer W by using a periphery removing device such as, but not limited to, a blade or a wheel, which is provided instead of the laser head 210 of the modifying apparatus 60. When removing the peripheral portion We, by performing the two-stage alignment by the macro-camera 230 and the micro-camera 240 as in the above-described exemplary embodiment, the position of the boundary R2 between the bonding region Aa and the non-bonding region Ab can be detected accurately. Thus, the peripheral portion We can be removed appropriately. That is, the function of the periphery removing device according to the present disclosure includes forming the peripheral modification layer M1 in addition to removing the peripheral portion We.

Further, though the macro-camera 230 configured to radiate the red light is used as the first detector in the above-described exemplary embodiment, the first detector is not limited thereto. By way of non-limiting example, a camera which is configured to radiate infrared light (IR light) may be used, or a displacement meter configured to radiate light to the outer end portion of the processing target wafer W may be used. The only requirement is that the peripheral portion of the processing target wafer W is included within the angle of view of the micro-camera 240 as the second detector through the macro-alignment by the first detector.

Furthermore, the above exemplary embodiment has been described for the case where the image magnification of the micro-camera 240 as the second imaging device is larger than the image magnification of the macro-camera 230 as the first imaging device. If, however, the combined wafer W can be transferred onto the chuck 200 accurately, that is, if the peripheral portion of the transferred processing target wafer W is included within the angle of view of the micro-camera 240, the first imaging device and the second imaging device need not be provided separately, and only the second imaging device may be provided.

In addition, in the above-described exemplary embodiment, the non-bonding region Ab is formed at the interface between the processing target wafer W and the support wafer S before being bonded, the non-bonding region Ab may be formed after they are bonded. For example, by radiating the laser light to the peripheral portion of the oxide film F after the processing target wafer W and the support wafer S are bonded to each other, the bonding strength may be reduced, and the non-bonding region Ab may be formed easily.

According to the exemplary embodiments, it is possible to remove, in the combined substrate in which substrates are bonded to each other, the peripheral portion of one of the substrates at the required position.

We claim:

1. A substrate processing apparatus configured to process a substrate, comprising:
 a holder configured to hold a combined substrate in which a first substrate and a second substrate are bonded to each other;
 a first camera or a displacement meter configured to detect an outer end portion of the first substrate;
 a second camera configured to detect a boundary between a bonding region where the first substrate and the second substrate are bonded and a non-bonding region located at an outside of the bonding region;
 a lens configured to radiate a laser light to form a peripheral modification layer which is a starting point for removing peripheral portion of the first substrate as a removing target from the combined substrate held by the holder;
 a holder moving mechanism configured to move the holder in a horizontal direction by a slider table that supports the holder and a driving source that moves the slider table in the horizontal direction; and
 a controller and a storage including a computer program, wherein the storage and the computer program are configured, with the controller, to control the holder, the first camera or the displacement meter, the second camera, the lens and the holder moving mechanism,
 wherein the controller performs:
 controlling the first camera or the displacement meter to detect the outer end portion of the first substrate;
 calculating a first eccentric amount between a center of the holder and a center of the first substrate from a detection result obtained by the first camera or the displacement meter;
 controlling the second camera to detect the boundary between the bonding region and the non-bonding region;
 calculating a second eccentric amount between the center of the holder and a center of the bonding region from a detection result obtained by the second camera; and
 determining a position of the holder with respect to the lens based on the second eccentric amount such that the center of the bonding region and a center of the peripheral portion are coincident.

2. The substrate processing apparatus of claim 1, wherein the holder moving mechanism comprises:
 a motor configured to rotate the holder; and
 a rail configured to move the holder in the horizontal direction between a carry-in/out position where the combined substrate is carried in/out and a modification layer forming position where the laser light is radiated from the lens.

3. The substrate processing apparatus of claim 2, wherein the second camera is configured to image the boundary between the bonding region and the non-bonding region, and
 the controller further performs:
 controlling, when the first eccentric amount does not include an eccentric amount in an orthogonal direction perpendicular to a moving direction of the holder by the holder moving mechanism, the holder moving mechanism to move the holder to correct an eccentric amount in the moving direction of the first eccentric amount;
 controlling the second camera to image the boundary between the bonding region and the non-bonding region in a circumferential direction while controlling the motor to rotate the holder; and
 calculating the second eccentric amount of the circumferential direction from an image obtained by the second camera.

4. The substrate processing apparatus of claim 2, wherein the second camera is configured to image the boundary between the bonding region and the non-bonding region, and
 the controller further performs:
 controlling, when the first eccentric amount includes an eccentric amount in an orthogonal direction perpendicular to a moving direction of the holder by the holder moving mechanism, the holder moving mechanism to move the holder to correct an eccentric amount in the moving direction of the first eccentric amount;
 controlling the second camera to image the boundary between the bonding region and the non-bonding region in a circumferential direction while controlling the motor to rotate the holder and controlling the holder moving mechanism to move the holder in the horizontal direction to correct the eccentric amount in the orthogonal direction of the first eccentric amount; and
 calculating the second eccentric amount in the circumferential direction from an image obtained by the second camera.

5. The substrate processing apparatus of claim 2, wherein the controller controls the periphery removing device to remove the peripheral portion while controlling the rotator to rotate the holder and controlling the holder moving mechanism to move the holder in the horizontal direction based on the second eccentric amount such that the center of the bonding region and the center of the peripheral portion are coincident.

6. The substrate processing apparatus of claim 1, wherein the lens forms the peripheral modification layer within the first substrate along a boundary between the peripheral portion and a central portion of the first substrate in the combined substrate held by the holder.

7. The substrate processing apparatus of claim 6, further comprising:
a split modification unit configured to form a split modification layer extending outwards from the peripheral modification layer in a diametrical direction within the first substrate,
wherein the controller corrects a length of the split modification layer in the diametrical direction based on the second eccentric amount.

8. The substrate processing apparatus of claim 6,
wherein the second camera is configured to image the peripheral modification layer, and
the controller controls the second camera to image the peripheral modification layer while controlling the lens to form the peripheral modification layer.

9. The substrate processing apparatus of claim 1, further comprising:
a detector moving mechanism configured to move the second camera in the horizontal direction.

10. The substrate processing apparatus of claim 1,
wherein the first detector is a first imaging device configured to image the outer end portion of the first substrate,
the second detector is a second imaging device configured to image the boundary between the bonding region and the non-bonding region, and
an image magnification of the second imaging device is higher than an image magnification of the first imaging device.

11. The substrate processing apparatus of claim 1,
wherein the first camera is configured to radiate visible light and receive reflection light from the combined substrate, and
the second camera is configured to radiate infrared light and receive reflection light from the combined substrate.

12. A substrate processing method of processing a substrate, comprising:
holding a combined substrate, in which a first substrate and a second substrate are bonded to each other, with a holder;
detecting an outer end portion of the first substrate;
calculating a first eccentric amount between a center of the holder and a center of the first substrate from a detection result of the detecting of the outer end portion of the first substrate;
detecting a boundary between a bonding region where the first substrate and the second substrate are bonded and a non-bonding region located at an outside of the bonding region;
calculating a second eccentric amount between the center of the holder and a center of the bonding region from a detection result of the detecting of the boundary between the bonding region and the non-bonding region;
determining, when forming a peripheral modification layer which is a starting point for removing a peripheral portion of the first substrate as a removing target from the combined substrate held by the holder by radiating a laser light from a lens, a position of the holder with respect to the lens based on the second eccentric amount such that the center of the bonding region and a center of the peripheral portion are coincident; and
forming the peripheral modification layer while rotating the holder and moving the holder in a horizontal direction such that the center of the bonding region and the center of the peripheral portion are coincident.

13. The substrate processing method of claim 12, further comprising:
controlling a first camera to image the outer end portion of the first substrate in a circumferential direction while controlling a motor to rotate the holder; and
calculating the first eccentric amount in the circumferential direction from an image obtained by the first camera.

14. The substrate processing method of claim 12,
wherein the holder is moved in a horizontal direction by a rail between a carry-in/out position where the combined substrate is carried in/out and a removing position where the peripheral portion is removed by the lens, and
the substrate processing method further comprises:
controlling, when the first eccentric amount does not include an eccentric amount in an orthogonal direction perpendicular to a moving direction of the holder by the rail, the rail to move the holder to correct an eccentric amount in the moving direction of the first eccentric amount;
controlling a second camera to image the boundary between the bonding region and the non-bonding region in a circumferential direction while controlling a motor to rotate the holder; and
calculating the second eccentric amount in the circumferential direction from an image obtained by the second camera.

15. The substrate processing method of claim 12,
wherein the holder is moved in a horizontal direction by a rail between a carry-in/out position where the combined substrate is carried in/out and a removing position where the peripheral portion is removed by the lens, and
the substrate processing method further comprises:
controlling, when the first eccentric amount includes an eccentric amount in an orthogonal direction perpendicular to a moving direction of the holder by the rail, the rail to move the holder to correct an eccentric amount in the moving direction of the first eccentric amount;
controlling a second camera to image the boundary between the bonding region and the non-bonding region in a circumferential direction while controlling a motor to rotate the holder and controlling the rail to move the holder in the horizontal direction to correct the eccentric amount in the orthogonal direction of the first eccentric amount; and
calculating the second eccentric amount in the circumferential direction from an image obtained by the second camera.

16. The substrate processing method of claim 12,
wherein the holder is moved in a horizontal direction by a rail between a carry-in/out position where the combined substrate is carried in/out and a removing position where the peripheral portion is removed by the lens, and
the peripheral portion is removed by the lens while controlling a motor to rotate the holder and controlling the rail to move the holder in the horizontal direction based on the second eccentric amount such that the center of the bonding region and the center of the peripheral portion are coincident.

17. The substrate processing method of claim 12,
wherein the lens forms a peripheral modification layer within the first substrate along a boundary between the peripheral portion and a central portion of the first substrate in the combined substrate held by the holder.

18. The substrate processing method of claim 17, further comprising:
forming, by a split modification unit, a split modification layer extending outwards from the peripheral modification layer in a diametrical direction within the first substrate,
wherein a length of the split modification layer in the diametrical direction is corrected based on the second eccentric amount.

19. The substrate processing method of claim 17,
wherein the peripheral modification layer is imaged while controlling the lens to form the peripheral modification layer.

20. The substrate processing method of claim 12,
wherein the detecting of the outer end portion of the first substrate is performed by controlling a first camera to image the outer end portion,
the detecting of the boundary between the bonding region and the non-bonding region is performed by controlling a second camera to image the boundary, and
an image magnification of the second camera is higher than an image magnification of the first camera.

21. A substrate processing apparatus configured to process a substrate, comprising:
a holder configured to hold a combined substrate in which a first substrate and a second substrate are bonded to each other;
a first camera or a displacement meter configured to detect an outer end portion of the first substrate;
a second camera configured to detect a boundary between a bonding region where the first substrate and the second substrate are bonded and a non-bonding region located at an outside of the bonding region;
a periphery removing device configured to remove a peripheral portion of the first substrate as a removing target from the combined substrate held by the holder;
a holder moving mechanism configured to move the holder in a horizontal direction by a slider table that supports the holder and a driving source that moves the slider table in the horizontal direction;
a motor configured to rotate the holder; and
a controller and a storage including a computer program, wherein the storage and the computer program are configured, with the controller, to control the holder, the first camera or a displacement meter, the second camera, the periphery removing device, the motor and the holder moving mechanism,
wherein the controller performs:
controlling the first camera or a displacement meter to detect the outer end portion of the first substrate;
calculating a first eccentric amount between a center of the holder and a center of the first substrate from a detection result obtained by the first camera or a displacement meter;
controlling the second camera to detect the boundary between the bonding region and the non-bonding region;
calculating a second eccentric amount between the center of the holder and a center of the bonding region from a detection result obtained by the second camera;
determining a position of the holder with respect to the periphery removing device based on the second eccentric amount such that the center of the bonding region and a center of the peripheral portion are coincident; and
removing the peripheral portion by the periphery removing device while rotating the holder by the motor and moving the holder by the holder moving mechanism in the horizontal direction such that the center of the bonding region and the center of the peripheral portion are coincident.

* * * * *